US008003010B2

(12) United States Patent
Landry et al.

(10) Patent No.: US 8,003,010 B2
(45) Date of Patent: *Aug. 23, 2011

(54) WATER-STABLE III-V SEMICONDUCTOR NANOCRYSTAL COMPLEXES AND METHODS OF MAKING SAME

(75) Inventors: Daniel Landry, Clifton Park, NY (US); Wei Lui, Schenectady, NY (US); Adam Peng, Schenectady, NY (US)

(73) Assignee: Samsung Electronics Co., Ltd. (KR)

( * ) Notice: Subject to any disclaimer, the term of this patent is extended or adjusted under 35 U.S.C. 154(b) by 639 days.

This patent is subject to a terminal disclaimer.

(21) Appl. No.: 11/353,957

(22) Filed: Feb. 15, 2006

(65) Prior Publication Data

US 2006/0202167 A1 Sep. 14, 2006

(51) Int. Cl.
C09K 11/02 (2006.01)
C09K 11/77 (2006.01)
B32B 5/16 (2006.01)
B32B 9/00 (2006.01)
B32B 15/02 (2006.01)
B32B 17/02 (2006.01)
B32B 19/00 (2006.01)
B32B 21/02 (2006.01)
B32B 23/02 (2006.01)
B32B 27/02 (2006.01)

(52) U.S. Cl. .......... 252/301.4 R; 428/403; 977/813; 977/815; 977/816; 977/817; 977/819; 977/820; 977/821

(58) Field of Classification Search ........... 252/301.4 R; 977/813, 815, 816, 817, 818, 819, 820, 821; 428/403

See application file for complete search history.

(56) References Cited

U.S. PATENT DOCUMENTS

| 5,525,377 | A | 6/1996 | Gallagher et al. | |
| 5,763,085 | A | 6/1998 | Atarashi et al. | |
| 6,048,616 | A | 4/2000 | Gallagher et al. | |
| 6,322,901 | B1 | 11/2001 | Bawendi et al. | |
| 6,344,272 | B1 | 2/2002 | Oldenburg et al. | |
| 6,835,455 | B2 | 12/2004 | Tanaka et al. | |
| 6,872,450 | B2 | 3/2005 | Liu et al. | |
| 6,921,496 | B2* | 7/2005 | Anderson et al. | 252/301.6 S |
| 7,068,898 | B2 | 6/2006 | Buretea et al. | |
| 7,144,627 | B2 | 12/2006 | Halas et al. | |
| 7,192,780 | B2 | 3/2007 | Liu et al. | |
| 7,399,429 | B2 | 7/2008 | Liu et al. | |
| 7,482,059 | B2 | 1/2009 | Peng et al. | |
| 2002/0187347 | A1* | 12/2002 | Halas et al. | 428/403 |
| 2003/0059955 | A1* | 3/2003 | Bamdad | 436/524 |
| 2005/0129947 | A1* | 6/2005 | Peng et al. | 428/403 |

OTHER PUBLICATIONS

Chan. Luminescent quantum dots for multiplexed biological detection and imaging. Current Opinion in biotechnology 2002, 13: 40-46.*

Brus, L., Quantum Crystallites and Nonlinear Optics, Applied Physics A, 53 (1991).
Rossetti, R.; Brus, L., Electron-Hole Recombination Emission as a Probe of Surface Chemistry in Aqueous CdS Colloids, J. Phys. Chem., 86, 172 (1982).
Fotjik, A., Henglein, A., Photochemistry of Colloidal Metal Sulfides, Photo-Physics of Extremely Small CdS Particles: Q-State CdS and Magic Agglomeration Numbers, Ber. Bunsenges. Phys. Chem., 88, (1984).
Fischer, C., Fotjik, A., Henglein, A., Photochemistry of Colloidal Semiconductors, Exclusion Chromatography and Stop Flow Experiments on the Formation of Extremely Small CdS Particles, Ber. Bunsenges. Phys. Chem., (1986).
Spanhel, L., Henglein, A., Photochemistry of Colloidal Semiconductors, Surface Modification and Stability of Strong Luminescing CdS Particles, Am. Chem. Soc., 109 (1987).
Kortan, R., Brus, L., Nucleation and Growth of CdSe on ZnS Quantum Crystallite Seeds, and Vice Versa, in Inverse Micelle Media, J. Am. Chem. Soc., 112 (1990).
Murray, C., Norris, D., Bawendi, M., Synthesis and Characterization of Nearly Monodisperse CdE (E=S, Se, Te) Semiconductor Nanocrystallites, J. Am. Chem. Soc., 115, (1993).
Katari, J., Alivisatos, A., X-ray Photoelectron Spectroscopy of CdSe Nanocrystals with Applications to Studies of the Nanocrystal Surface, J. Phys. Chem., 98 (1994).
Hines, et al., Synthesis and Characterization of Strongly Luminescing ZnS Capped CdSe Nanocrystals, J. Phys. Chem., 100:468-471 (1996).
Haubold, S., et al., Strongly Luminescent InP/ZnS Core-Shell Nanoparticles, ChemPhysChem 2001, 5, 331-334 (2001).
Micic, O., Nozik, A., Synthesis and Characterization of Binary and Ternary III-V Quantum Dots, J. Luninescence, 70, 95-107 (1996).
Blackburn et al., article entitled, "Electron and Hole Transfer from Indium Phosphide Quantum Dots", J. Phys. Chem. B., 2005, vol. 109, pp. 2625-2631.
Talapin et al., article entitled, "Etching of Colloidal InP Nanocrystals with Fluorides: Photochemical Nature of the Process Resulting in High Photoluminescence Efficiency", J. Phys. Chem. B., 2002, pp. 12659-12663, vol. 106.
Battaglia et al., article entitled, "Formation of High Quality InP and InAs Nanocrystals in a Noncoordinating Solvent", Nano Letters, 2002, pp. 1027-1030, vol. 2, No. 9.
Borchert et al., article entitled, "Investigation of ZnS Passivated InP Nanocrystals by XPS", Nano Letters, 2002, pp. 151-154, vol. 2, No. 2.
Nagesha et al., article entitled, "$In_2S_3$ Nanocolloids with Excitonic Emission: $In_2S_3$ vs CdS Comparative Study of Optical and Structural Characteristics", J. Phys. Chem. B, 2001, pp. 7490-7498, vol. 105.

(Continued)

Primary Examiner — C. Melissa Koslow
Assistant Examiner — Matthew E Hoban
(74) Attorney, Agent, or Firm — Cantor Colburn LLP

(57) ABSTRACT

A water-stable semiconductor nanocrystal complex that is stable and has high luminescent quantum yield. The water-stable semiconductor nanocrystal complex has a semiconductor nanocrystal core of a III-V semiconductor nanocrystal material and a water-stabilizing layer. A method of making a water-stable semiconductor nanocrystal complex is also provided.

20 Claims, 4 Drawing Sheets

OTHER PUBLICATIONS

Micic et al., article entitled, "Core-Shell Quantum Dots of Lattice-Matched ZnCdSe$_2$ Shells on InP Cores: Experiment and Theory", J. Phys. Chem. B, 2000, pp. 12149-12156, vol. 104.

Cao et al., article entitled, "Growth and Properties of Semiconductor Core/Shell Nanocrystals with InAs Cores", J. Am. Chem. Soc., 2000, pp. 9692-9702, vol. 122.

A. Segura et al., article entitled, "Strong optical nonlinearities in gallium and indium selenides related to inter-valence-band transitions induced by light pulses", Physical Review B., pp. 4075-4084, vol. 56, #7, Aug. 15, 1997.

A. Guzelian et al., article entitled, "Synthesis of Size-Selected, Surface-Passivated InP Nanocrystals", J. Phys. Chem., 1996, pp. 7212-7219, vol. 100.

Micic et al., article entitled, "Synthesis and Characterization of InP, GaP, and GaInP$_2$ Quantum Dots", J. Phys. Chem. 1995, pp. 7754-7759.

Micic et al., article entitled, "Synthesis and Characterization of InP Quantum Dots", J. Phy. Chem., 1994, pp. 4966-4969, vol. 98.

Olga.l. Micic et al., "Synthesis and characterization of binary and ternary III-V quantum dots", Journal of Luminescence, vol. 70, Issues 1-6, Oct. 1996, pp. 95-107.

Olga I. Micic, et al., "Highly efficient band-edge emission from InP quantum dots", American Institue of Physics, vol. 68, May 27, 1996, pp. 3150-3152.

Lin et al., "Carrier Transfer Induced Photoluminescence Change in Metal-Semiconductor Core-Shell Nanostructures", Applied Physics Letters 88, 161911, 2006, 3 pages.

* cited by examiner

WATER-STABLE III-V SEMICONDUCTOR NANOCRYSTAL COMPLEXES AND METHODS OF MAKING SAME

FIELD OF THE INVENTION

The present invention relates to water-stable semiconductor nanocrystal complexes and particularly to water-stable III-V semiconductor nanocrystal complexes. The present invention also relates to methods of making water-stable semiconductor nanocrystal complexes.

BACKGROUND OF THE INVENTION

Semiconductor nanocrystals are typically tiny crystals of II-VI, III-V, IV-VI materials that have a diameter between 1 nanometer (nm) and 20 nm. In the strong confinement limit, the physical diameter of the nanocrystal is smaller than the bulk excitation Bohr radius causing quantum confinement effects to predominate. In this regime, the nanocrystal is a 0-dimensional system that has both quantized density and energy of electronic states where the actual energy and energy differences between electronic states are a function of both the nanocrystal composition and physical size. Larger nanocrystals have more closely spaced energy states and smaller nanocrystals have the reverse. Because interaction of light and matter is determined by the density and energy of electronic states, many of the optical and electric properties of nanocrystals can be tuned or altered simply by changing the nanocrystal geometry (i.e. physical size).

Single nanocrystals or monodisperse populations of nanocrystals exhibit unique optical properties that are size tunable. Both the onset of absorption and the photoluminescent wavelength are a function of nanocrystal size and composition. The nanocrystals will absorb all wavelengths shorter than the absorption onset, however, photoluminescence will always occur at the absorption onset. The bandwidth of the photoluminescent spectra is due to both homogeneous and inhomogeneous broadening mechanisms. Homogeneous mechanisms include temperature dependent Doppler broadening and broadening due to the Heisenburg uncertainty principle, while inhomogeneous broadening is due to the size distribution of the nanocrystals. The narrower the size distribution of the nanocrystals, the narrower the full-width half max (FWHM) of the resultant photoluminescent spectra. In 1991, Brus wrote a paper reviewing the theoretical and experimental research conducted on colloidally grown semiconductor nanocrystals, such as cadmium selenide (CdSe) in particular. Brus L., *Quantum Crystallites and Nonlinear Optics, Applied Physics A*, 53 (1991)). That research, precipitated in the early 1980's by the likes of Efros, Ekimov, and Brus himself, greatly accelerated by the end of the 1980's as demonstrated by the increase in the number of papers concerning colloidally grown semiconductor nanocrystals.

Quantum yield (i.e. the percent of absorbed photons that are reemitted as photons) is influenced largely by the surface quality of the nanocrystal. Photoexcited charge carriers will emit light upon direct recombination but will give up the excitation energy as heat if photon or defect mediated recombination paths are prevalent. Because the nanocrystal may have a large surface area to volume ratio, dislocations present on the surface or adsorbed surface molecules having a significant potential difference from the nanocrystal itself will tend to trap excited state carriers and prevent radioactive recombination and thus reduce quantum yield. It has been shown that quantum yield can be increased by removing surface defects and separating adsorbed surface molecules from the nanocrystal by adding a shell of a semiconductor with a wider bulk bandgap than that of the core semiconductor.

Inorganic colloids have been studied for over a century ever since Michael Faraday's production of gold sols in 1857. Rossetti and Brus began work on semiconductor colloids in 1982 by preparing and studying the luminescent properties of colloids consisting of II-VI semiconductors, namely cadmium sulfide (CdS). (Rossetti, R.; Brus L., *Electron-Hole Recombination Emission as a Probe of Surface Chemistry in Aqueous CdS Colloids, J. Phys. Chem.*, 86, 172 (1982)). In that paper, they describe the preparation and resultant optical properties of CdS colloids, where the mean diameter of the suspended particles is greater than 20 nm. Because the sizes of the particles were greater than the exaction Bohr radius, quantum confinement effects that result in the blue shifting of the fluorescence peak was not observed. However, fluorescence at the bulk bandedge energies were observed and had a FWHM of 50-60 nm.

CdS colloids exhibiting quantum confinement effects (blue shifted maxima in the absorption spectra) were being prepared since 1984. (Fotjik A., Henglein A., *Ber. Bunsenges. Phys. Chem.*, 88, (1984); Fischer C., Fotjik A., Henglein A., *Ber. Bunsenges. Phys. Chem.*, (1986)). In 1987, Spanhel and Henglein prepared CdS colloids having mean particle diameters between 4 and 6 nm. (Spanhel L., Henglein A., *Photochemistry of Colloidal Semiconductors, Surface Modification and Stability of Strong Luminescing CdS Particles, Am. Chem. Soc.*, 109 (1987)). The colloids demonstrated quantum confinement effects including the observation of size dependent absorption maxima (first exciton peaks) as well as size dependent fluorescent spectra. The colloids were prepared by bubbling a sulphur containing gas ($H_2S$) through an alkaline solution containing dissolved cadmium ions. The size and resultant color (of the fluorescence) of the resultant nanocrystals were dependent upon the pH of the solution. The colloids were further modified or "activated" by the addition of cadmium hydroxide to the solution that coated the suspended nanocrystals. The resultant core-shell nanocrystals demonstrated that the quantum yield of the photoluminescence was increased from under 1% to well over 50% with a FWHM of the photoluminescent spectra under 50 nm for some of the preparations.

Kortan and Brus developed a method for creating CdSe coated zinc sulphide (ZnS) nanocrystals and the opposite, zinc sulphide coated cadmium selenide nanocrystals. (Kortan R., Brus L., *Nucleation and Growth of CdSe on ZnS Quantum Crystallite Seeds, and Vice Versa, in Inverse Micelle Media, J. Am. Chem. Soc.*, 112 (1990)). The preparation grew ZnS on CdSe "seeds" using a organometallic precursor-based reverse micelle technique and kept them in solution via an organic capping layer (thiolphenol). The CdSe core nanocrystals had diameters between 3.5 and 4 nm and demonstrated quantum confinement effects including observable exciton absorption peaks and blue shifted photoluminescence. Using another preparation, CdSe cores were coated by a 0.4 nm layer of ZnS. The photoluminescence spectra of the resultant core-shell nanocrystals indicates a peak fluorescence at 530 nm with an approximate 40-45 nm FWHM.

Murray and Bawendi developed an organometallic preparation capable of making CdSe, CdS, and CdTe nanocrystals. (Murray C., Norris D., Bawendi M., *Synthesis and Characterization of Nearly Monodisperse CdE (E=S, Se, Te) Semiconductor Nanocrystallites, J. Am. Chem. Soc.*, 115, (1993)). This work, based on the earlier works of Brus, Henglein, Peyghambarian, allowed for the growth of nanocrystals having a diameter between 1.2 nm and 11.5 nm and with a narrow size distribution (<5%). The synthesis involved a homogeneous nucleation step followed by a growth step. The nucleation step is initiated by the injection of an organometallic cadmium precursor (dimethyl cadmium) with a selenium precursor (TOPSe-TriOctylPhosphine Selenium) into a heated bath containing coordinating ligands (TOPO-TriOctylPhosphineOxide). The precursors disassociate in the solvent, causing the cadmium and selenium to combine to form a growing nanocrystal. The TOPO coordinates with the nanocrystal to moderate and control the growth. The resultant nanocrystal solution showed an approximate 10% size distribution, however, by titrating the solution with methanol the larger nanocrystals could be selectively precipitated from the solution thereby reducing the overall size distribution. After size selective precipitation, the resultant nanocrystals in solution were monodisperse (capable of reaching a 5% size distribution) but were slightly prolate (i.e. nonspherical having an aspect ratio between 1.1 and 1.3). The photoluminescence spectra show a FWHM of approximately 30-35 nm and a quantum yield of approximately 9.6%.

Katari and Alivisatos slightly modified the Murray preparation to make CdSe nanocrystals. (Katari J., Alivisatos A., *X-ray Photoelectron Spectroscopy of CdSe Nanocrystals with Applications to Studies of the Nanocrystal Surface, J. Phys. Chem.*, 98 (1994)). They found that by substituting the selenium precursor TOPSe with TBPSe (TriButylPhosphineSelenide), nanocrystals were produced that were monodisperse without size selective precipitation, were crystalline, and spherical. The nanocrystals were size tunable from 1.8 nm to 6.7 nm in diameter and had an exciton peak position ranging from 1.9-2.5 eV (corresponding to 635-496 nm wavelength). Like the Murray paper, TOPO was used as the coordinating ligand.

Hines and Guyot-Sionest developed a method for synthesizing a ZnS shell around a CdSe core nanocrystal. (Hines et al., "Synthesis and Characterization of strongly Luminescing ZnS capped CdSe Nanocrystals"; *J. Phys. Chem.*, 100:468-471 (1996)). The CdSe cores, having a monodisperse distribution between 2.7 nm and 3.0 nm (i.e. 5% size distribution with average nanocrystal diameter being 2.85 nm), were produced using the Katari and Alivisatos variation of the Murray synthesis. The photoluminescence spectra of the core shows a FWHM of approximately 30 nm with a peak at approximately 540 nm. The core CdSe nanocrystals were separated, purified, and resuspended in a TOPO solvent. The solution was heated and injected with zinc and sulphur precursors (dimethyl zinc and $(TMS)_2S$) to form a ZnS shell around the CdSe cores. The resultant shells were 0.6±3 nm thick, corresponding to 1-3 monolayers. The photoluminescence of the core-shell nanocrystals had a peak at 545 nm, FWHM of 40 nm, and a quantum yield of 50%.

One exemplary problem associated with known colloidal shell synthesis methods is that they are limited in regard to the growth of high quality III-V semiconductor nanocrystals due, at least in part, to the covalent nature of the material. Past attempts at growing III-V semiconductor nanocrystals have resulted in quantum yields of approximately 10%. Micic et al., *J. Phys. Chem. B*. 2000, 104, 12149-12156. It has been shown using a slow growth technique that indium phosphate (InP) core nanocrystals with a shell of zinc sulphide (ZnS) may result in quantum yields of 20% but this process takes days to complete. Haubold et al., *Chem Phys Chem* 2001, 5, 331. Many applications of nanocrystal complexes, such as LEDs, inks, and pigments, require higher luminescent quantum yields.

Additionally, the growth of III-V nanocrystals is difficult because of the need for vacuum growth and strict humidity conditions. Etching has shown to improve the quantum yield of III-V materials however, the etching process introduces problems when bonding ligands to the surface of the nanocrystals. This causes poor colloidal stability and makes the complexes incompatible for a variety of applications. In addition, the etched surface does not provide sufficient electronic passivation. As a result, electronic interaction between a matrix material and the nanocrystal may result in fluorescence quenching.

Additionally, etching relies on photoexcitation, which requires dilute mixtures. This is not conducive to the scale up and production of large quantities of III-V semiconductor nanocrystal complexes. By readily losing their fluorescence, these quantum dot materials are simply unsuitable for most applications. Thus, it is necessary to develop a stable III-V semiconductor nanocrystal complex that is brightly fluorescing, and soluble in water.

SUMMARY OF THE INVENTION

In an embodiment, the present invention provides a water-stable semiconductor nanocrystal complex. The water-stable semiconductor nanocrystal complex comprises a semiconductor nanocrystal composition including a III-V semiconductor nanocrystal core. The water-stable semiconductor nanocrystal complex also includes a surface layer comprising molecules having a moiety with an affinity for the semiconductor nanocrystal composition and a moiety with an affinity for a hydrophobic solvent. The water-stable semiconductor nanocrystal complex further comprises a water-stablizing layer having a hydrophobic end for interacting with the surface layer and a hydrophilic end for interacting with an aqueous medium. The water-stable semiconductor nanocrystal complex is electronically and chemically stable with a luminescent quantum yield of at least 25%.

Additionally, the present invention provides for a method of making a water stable semiconductor nanocrystal complex comprising synthesizing a semiconductor nanocrystal core comprising a III-V semiconductor nanocrystal material. The method further comprises forming a surface layer either directly or indirectly on the semiconductor nanocrystal core, and forming a water-stabilizing layer on the surface layer. The water-stabilizing layer has a hydrophobic end for interacting with the surface layer and a hydrophilic end for interacting with an aqueous medium.

DETAILED DESCRIPTION OF THE INVENTION

Figure 1:
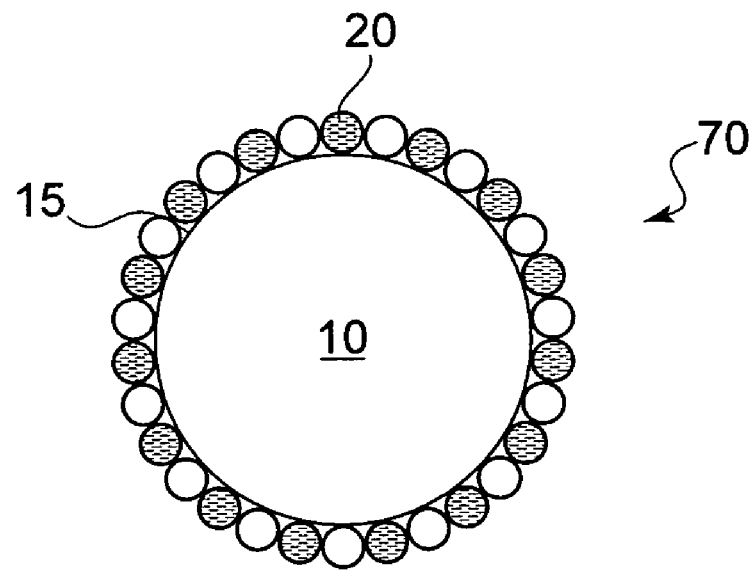
FIG. 1 is a schematic illustration of a semiconductor nanocrystal composition according to an embodiment of the present invention.

Referring to FIG. 1, in an embodiment, the present invention provides a semiconductor nanocrystal composition 70 comprising a semiconductor nanocrystal core 10 (also known as a semiconductor nanoparticle or semiconductor quantum dot) having an outer surface 15. Semiconductor nanocrystal core 10 may be spherical nanoscale crystalline materials (although oblate and oblique spheroids can be grown as well as rods and other shapes) having a diameter of less than the Bohr radius for a given material and typically but not exclusively comprises II-IV, III-V, or IV-VI binary semiconductors. Non-limiting examples of semiconductor materials that semiconductor nanocrystal core 10 can comprise include ZnS, ZnSe, ZnTe, CdS, CdSe, CdTe, HgS, HgSe, HgTe (II-VI materials), PbS, PbSe, PbTe (IV-VI materials), AlN, AlP, AlAs, AlSb, GaN, GaP, GaAs, GaSb, InN, InP, InAs, InSb (III-V materials). In a preferred embodiment, semiconductor nanocrystal core 10 comprises III-V semiconductor nanocrystal materials. In addition to binary semiconductors, semiconductor nanocrystal core 10 may comprise ternary semiconductor materials. Non-limiting examples of ternary semiconductor materials include AxByC wherein A may comprise a group II, III or IV element, B may comprise a group II, III, or IV element, and C may comprise a group V or VI element, and x and y are molar fractions between 0 and 1.

In an embodiment, one or more metals 20 are formed on outer surface 15 of semiconductor nanocrystal core 10 (referred to herein as "metal layer" 20). Metal layer 20 may act to passivate outer surface 15 of semiconductor nanocrystal core 10 and limit the diffusion rate of oxygen molecules to semiconductor nanocrystal core 10. According to the present invention, metal layer 20 is formed on outer surface 15 after synthesis of semiconductor nanocrystal core 10 (as opposed to being formed on outer surface 15 concurrently during synthesis of semiconductor nanocrystal core 10). Metal layer 20 may include any number, type, combination, and arrangement of metals. For example, metal layer 20 may be simply a monolayer of metals formed on outer surface 15 or multiple layers of metals formed on outer surface 15. Metal layer 20 may also include different types of metals arranged, for example, in alternating fashion. Further, metal layer 20 may encapsulate semiconductor nanocrystal core 10 as shown in FIG. 1 or may be formed on only parts of outer surface 15 of semiconductor nanocrystal core 10. Metal layer 20 may include the metal from which the semiconductor nanocrystal core is made either alone or in addition to another metal. Non-limiting examples of metals that may be used as part of metal layer 20 include Cd, Zn, Hg, Pb, Al, Ga, or In.

Semiconductor nanocrystal composition 70, according to the present invention, is electronically and chemically stable with a high luminescent quantum yield. Chemical stability refers to the ability of a semiconductor nanocrystal composition to resist fluorescence quenching over time in aqueous and ambient conditions. Preferably, the semiconductor nanocrystal compositions resist fluorescence quenching for at least a week, more preferably for at least a month, even more preferably for at least six months, and most preferably for at least a year. Electronic stability refers to whether the addition of electron or hole withdrawing ligands substantially quenches the fluorescence of the semiconductor nanocrystal composition. Preferably, a semiconductor nanocrystal composition would also be colloidally stable in that when suspended in organic or aqueous media (depending on the ligands) they remain soluble over time. A high luminescent quantum yield refers to a quantum yield of at least 25%. Quantum yield may be measured by comparison to Rhodamine 6G dye with a 488 excitation source. Preferably, the quantum yield of the semiconductor nanocrystal composition is at least 30%, more preferably at least 45%, and even more preferably at least 55%, as measured under ambient conditions. The semiconductor nanocrystal compositions of the present invention experience little loss of fluorescence over time and can be manipulated to be soluble in organic and inorganic solvents as traditional semiconductor nanocrystals.

Semiconductor nanocrystal core 10 and metal layer 20 may be grown by the pyrolysis of organometallic precursors in a chelating ligand solution or by an exchange reaction using the prerequisite salts in a chelating ligand solution. The chelating ligands are typically lyophilic and have an affinity moiety for the metal layer and another moiety with an affinity toward the solvent, which is usually hydrophobic. Typical examples of chelating ligands include lyophilic surfactant molecules such as Trioctylphosphine oxide (TOPO), Trioctylphosphine (TOP), and Tributylphosphine (TBP).

Figure 2:
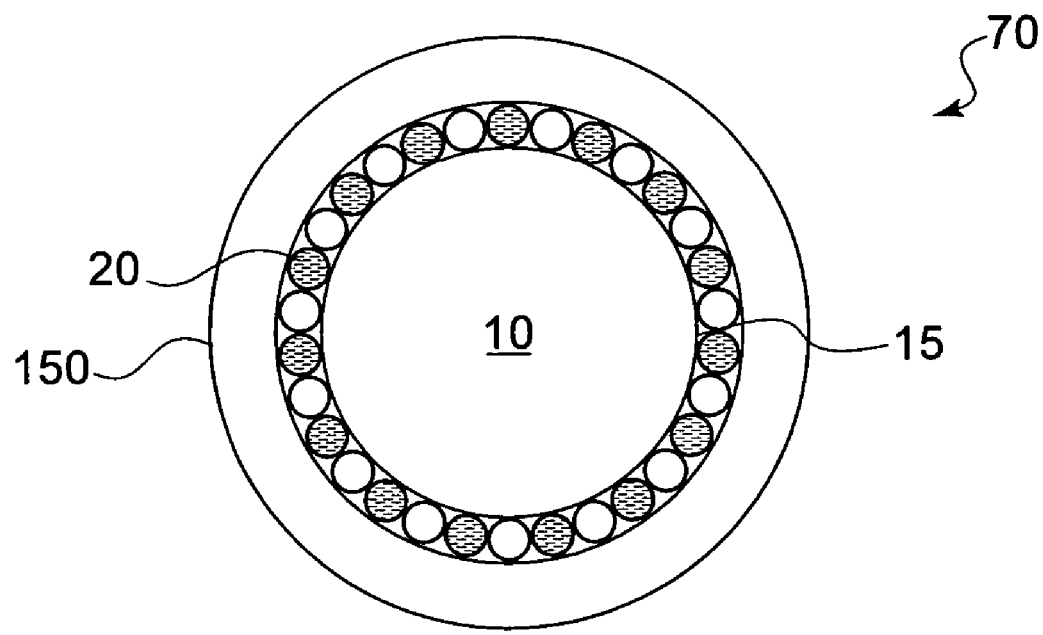
FIG. 2 is a schematic illustration of a semiconductor nanocrystal composition according to another embodiment of the present invention.

Referring to FIG. 2, in an alternative embodiment, the present invention provides a nanocrystal composition 70 further comprising a shell 150 overcoating metal layer 20. Shell 150 may comprise a semiconductor material having a bulk bandgap greater than that of semiconductor nanocrystal core 10. In such an embodiment, metal layer 20 may act to passivate outer surface 15 of semiconductor nanocrystal core 10 as well as to prevent or decrease lattice mismatch between semiconductor nanocrystal core 10 and shell 150.

Shell 150 may be grown around metal layer 20 and is typically between 0.1 nm and 10 nm thick. Shell 150 may provide for a type A semiconductor nanocrystal composition 70. Shell 150 may comprise various different semiconductor materials such as, for example, CdSe, CdS, CdTe, ZnS, ZnSe, ZnTe, HgS, HgSe, HgTe, InP, InAs, InSb, InN, GaN, GaP, GaAs, GaSb, PbSe, PbS, or PbTe.

One example of shell 150 that may be used to passivate outer surface 15 of semiconductor nanocrystal core 10 is ZnS. The presence of metal layer 20 may provide for a more complete and uniform shell 150 without the amount of defects that would be present with a greater lattice mismatch. Such a result may improve the quantum yield of resulting nanocrystal composition 70.

Semiconductor nanocrystal core 10, metal layer 20, and shell 150 may be grown by the pyrolysis of organometallic precursors in a chelating ligand solution or by an exchange reaction using the prerequisite salts in a chelating ligand solution. The chelating ligands are typically lyophilic and have an affinity moiety for the metal layer and another moiety with an affinity toward the solvent, which is usually hydrophobic. Typical examples of chelating ligands include lyophilic surfactant molecules such as Trioctylphosphine oxide (TOPO), Trioctylphosphine (TOP), and Tributylphosphine (TBP).

Figure 3:
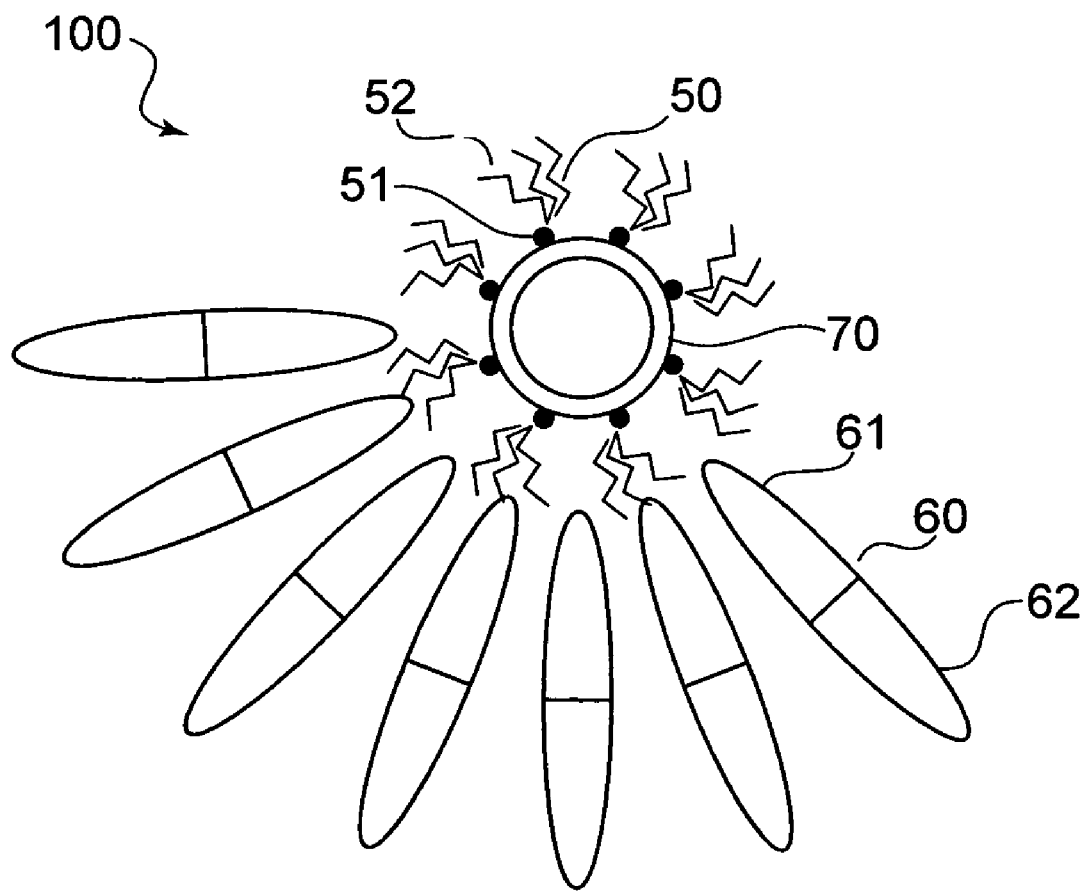
FIG. 3 is a schematic illustration of a water-stable semiconductor nanocrystal complex according to an embodiment of the present invention.

Referring to FIG. 3, the present invention also provides a water-stable semiconductor nanocrystal complex 100 comprising a semiconductor nanocrystal composition described above and further comprising a surface layer 50 that coats the semiconductor nanocrystal composition. Surface layer 50 generally comprises surface organic molecules that have a moiety 51 with an affinity for semiconductor nanocrystal composition 70 and another moiety 52 with an affinity for a hydrophobic solvent. Moieties that have an affinity for a nanocrystal surface include thiols, amines, phosphines, and phosphine oxides. Non-limiting examples of surface molecules comprising surface layer 50 include trioctyl phosphine oxide (TOPO), trioctyl phosphine (TOP), tributyl phosphine (TBP), dodecyl amine, octadecyl amine, hexadecylamine, stearic acid, oleic acid, palmitic acid, lauric acid, and any combinations thereof. Such surface molecules are typically used in the synthesis of semiconductor nanocrystal compositions and can remain on the surface of the nanocrystals after synthesis or may be replaced by other surfactants after synthesis. As is generally known to one of skill in the art, semiconductor nanocrystals according to the present invention may be coated with a surface layer by pyrolysis of organometallic percursors in a chelating ligand solution or by an exchange reaction using the prerequisite salts in a chelating surface solution, such chelating surfaces typically being lyophilic.

Referring still to FIG. 3, a water-stable semiconductor nanocrystal complex of the present invention further comprises a water-stabilizing layer 60. Water stabilizing layer 60 preferably comprises lipids or polymer-based small molecules including amino acids with a hydrophilic end section 62 and a hydrophobic end section 61. The hydrophobic end section of a water-stabilizing layer has an affinity for a surface layer present on the surface of a semiconductor nanocrystal composition.

In an embodiment, a water-stabilizing layer comprises diblock polymers that surround the semiconductor nanocrystal composition to form a micelle. More than one surface-coated semiconductor nanocrystal composition of the present invention may be surrounded by a diblock polymer coating. A diblock polymer is generally but not exclusively a linear chain that has a hydrophobic end comprising hydrophobic functional groups that is covalently bonded to a hydrophilic end comprising hydrophilic functional groups. In an aqueous medium, a diblock polymer coating assembles around a surface-coated semiconductor nanocrystal composition of the present invention. Specifically, the hydrophobic end of a diblock polymer is attracted to the surface-coated nanocrystal composition and interacts with the moiety of the surface layer that has an affinity for a hydrophobic solvent through noncovalent interactions such as, for example, hydrogen bonding, Van der Waals Forces, and hydrophobic interactions. The hydrophilic end of a diblock polymer, in turn, is directed to the aqueous medium.

With respect to the lengths of the hydrophobic and hydrophilic end of a diblock polymer, each end has lengths greater than 1 and preferably each have lengths between 1 and 1000. In a more preferred embodiment, the hydrophobic end of a diblock polymer has between 60 and 180 carbon atoms. In a more preferred embodiment, the hydrophobic end has about 150 carbon atoms and the hydrophilic end has about 220-240 carbon atoms. Also in a preferred embodiment, the hydrophobic end has about 10-20 monomer units and the hydrophilic end has about 110-120 monomer units. Although the hydrophilic end and the hydrophobic end may have different lengths, in a preferred embodiment, they are substantially equal in length.

The hydrophobic functional groups of the hydrophobic end of a diblock polymer that can be used as a water-stabilizing layer are preferably groups of covalently bonded atoms on a larger molecule that are nonpolar and not ionizable and therefore have an affinity for nonpolar and non-ionizable solvents. Non-limiting examples of hydrophobic functional groups according to the present invention include hydrocarbons of various lengths. The hydrophilic functional groups of the hydrophilic end are preferably groups of atoms on a larger molecule that are highly polar or ionizable and therefore have an affinity for water and other polar solvents. Non-limiting examples of hydrophilic functional groups include hydroxy, amine, carboxyl, sulfonates, phosphates, amines, nitrates, and any combinations thereof.

Non-limiting examples of diblock polymers that comprise a diblock polymer coating surrounding a surface-coated semiconductor nanocrystal composition according to an embodiment of the present invention include poly(acrylic acid-b-methyl methacrylate), poly(methyl methacrylate-b-sodium acrylate), poly(t-butyl methacrylate-b-ethylene oxide), poly(methyl methacrylate-b-sodium methacrylate), poly(methyl methacrylate-b-N-methyl 1-4vinyl pyridinium iodide), poly(methyl methacrylate-b-N,N-dimethyl acrylamide), poly(butadiene-b-methacrylate acid and sodium salt), poly(butadiene(1,2 addition)-b-acrylic acid), poly(butadiene (1,2 addition)-b-sodium acrylate), poly(butadiene(1,4 addition)-b-acrylic acid), poly(butadiene(1,4 addition)-b-sodium acrylate), poly(butadiene(1,4 addition)-b-ethylene oxide), poly(butadiene(1,2 addition)-b-ethylene oxide), poly(styrene-b-acrylic acid), poly(styrene-b-acrylamide), poly(styrene-b-cesium acrylate), poly(styrene-b-sodium acrylate), poly(styrene-b-ethylene oxide), poly(styrene-b-methacrylic acid), poly(styrene-b-sodium methacrylate), and any combinations thereof.

In order to form a cohesive coating around a surface-coated semiconductor nanocrystal composition of the present invention, adjacent diblock polymers of a diblock polymer coating are linked together by bridging molecules. Preferably, the bridging molecules are multidentate bridging molecules having one or more reactive functional groups that can react with and bond to one or more hydrophilic functional groups of the hydrophilic end thereby crosslinking adjacent diblock polymers together. Therefore, the self-assembled diblock polymer coating is knit together to form a cohesive coating around a surface-coated semiconductor nanocrystal composition of the present invention that will not dissociate in water over long periods. The multidentate bridging molecule may have one or more than one type of reactive functional group. Non-limiting examples of such reactive functional groups include hydroxy (OH), carboxylate (COOH), amine ($NH_2$) groups, and any combinations thereof. In a preferred embodiment, a bridging molecule is diamine, 2,2'-(ethylenedioxy) bis(ethylamine) and the amine functional groups on the diamine react with hydrophilic functional groups that are carboxylate groups on a hydrophilic end of a diblock polymer to form a stable peptide bond.

In another embodiment, the water-stabilizing layer is a layer of PEGylated phospholipids. In a preferred embodiment, the hydrophobic end of the PEGylated phospholipid comprises fatty acyl groups in a phospholipid such as 1,2-di(fatty acyl)-sn-glycero-3-phosphoethanolamine and the hydrophilic end is polyethylene glycol.

The performance of semiconductor nanocrystal complexes of the present invention as dependable biological research tools is related to their ability to withstand the stringent conditions found in most cellular contexts. Oxidative stress, changes in salt concentration, pH, and temperature, as well as proteolytic susceptibility are some examples of the conditions these nanocrystals need to withstand in order to be useful in aqueous biological assays.

In addition to providing a layer of water stability to the semiconductor nanocrystal composition, water-stabilizing layer can also provide surface exposed functional groups to facilitate the conjugation of ligands or tertiary molecules for target specific applications. This is the layer of the semiconductor nanocrystal complex that opens opportunity for the biologist to exploit an entire host of molecular interactions. For example, the semiconductor nanocrystal surfaces can be 'tagged' with a bio-recognition molecule (e.g., antibody, peptide, small molecule drug or nucleic acid) designed to target only the molecular signature of interest (e.g., cell surface receptor proteins, viral DNA sequences, disease antigens.) The interaction of the 'tagged' semiconductor nanocrystal with its target could then be visualized with the appropriate fluorescence detection and imaging equipment.

Functional groups exposed on the surface of a water-stable semiconductor nanocrystal complex can be coupled to nucleic acids, proteins, antibodies, or small molecules and can serve as the basis for many types of in vitro detection assays. Some examples of applicable assays include, DNA/RNA assays and microarrays; high throughput screens; whole blood and tissue screening in medical diagnostics; immunoassays, dot blots and other membrane-based detection technologies. Functional groups include but are not limited to alcohol (OH), carboxylate (COOH), and amine (NH2), hydroxy, carboxyl, sulfonates, phosphates, nitrates, and any combinations thereof. More than one type of functional group may be present on the surface of the water-stabilizing layer. In addition to comprising functional groups on its surface, a water-stable semiconductor nanocrystal complex may comprise one or more tertiary molecules.

The term tertiary molecule refers to any molecule that can be covalently coupled to the water-stable semiconductor nanocrystal complex. The coupling of tertiary molecules to a water-stable semiconductor nanocrystal complex is achieved by reacting functional groups present on the tertiary molecule with hydrophilic functional groups present on the water-stabilizing layer of a water-stable semiconductor nanocrystal complex. Tertiary molecules include members of specific binding pairs such as, for example, an antibody, antigen, hapten, antihapten, biotin, avidin, streptavidin, IgG, protein A, protein G, drug receptor, drug, toxin receptor, toxin, carbohydrate, lectin, peptide receptor, peptide, protein receptor, protein, carbohydrate receptor, carbohydrate, polynucleotide binding protein, polynucleotide, DNA, RNA, aDNA, aRNA, enzyme, and substrate. Other non-limiting examples of tertiary molecules include a polypeptide, glycopeptide, peptide nucleic acid, oligonucleotide, aptamer, cellular receptor molecule, enzyme cofactor, oligosaccharide, a liposaccharide, a glycolipid, a polymer, a metallic surface, a metallic particle, and a organic dye molecule. Depending on the material used for the water-stabilizing layer, the tertiary molecule may be part of the water-stabilizing layer. For example, in the event that the water-stabilizing layer comprises a biotin terminated lipid, then the tertiary molecule (the biotin) would be a part of the water-stabilizing layer. One or more of the same or different tertiary molecules can be coupled to a water-stable semiconductor nanocrystal complex of the present invention.

Figure 4:
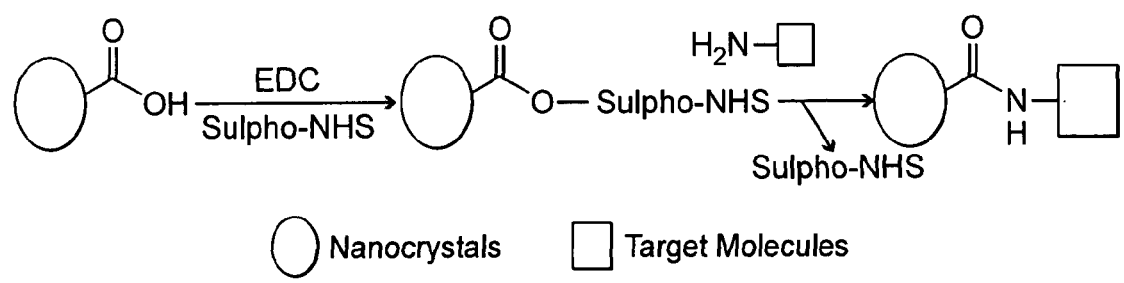
FIG. 4 is an exemplary conjugation method to conjugate tertiary molecules to a water-stable semiconductor nanocrystal complex of the present invention.

An example conjugation method to conjugate tertiary molecules to the functional groups of a water-stabilizing layer of a water-stable semiconductor nanocrystal complex is illustrated in FIG. 4. Using this protocol, many semiconductor nanocrystals complexes that possess functional moieties suitable for conjugation to biomolecules can be prepared. The functional groups to be employed include, but are not limited to, carboxylic acids, amines, sulfhydryls and maleimides. Established protein or nucleic acid conjugation protocols can then be used to generate customized ligand-bound semiconductor nanocrystals in a straightforward manner. The method depicted in FIG. 4, uses EDC (1-ethyl-3(3-dimethylaminopropyl) carbodimide HCl) and sulfo-NHS(N-hydrocylsulfosuccinimide) to form active esters on the surface of the semiconductor nanocrystal complex. Once the unreacted EDC and sulfo-NHS are removed, a protein of interest may be added and efficiently conjugated to a water-stable semiconductor nanocrystal complex.

The present invention also provides a substantially monodisperse population of water-stable semiconductor nanocrystal complexes, as described above.

Figure 5:
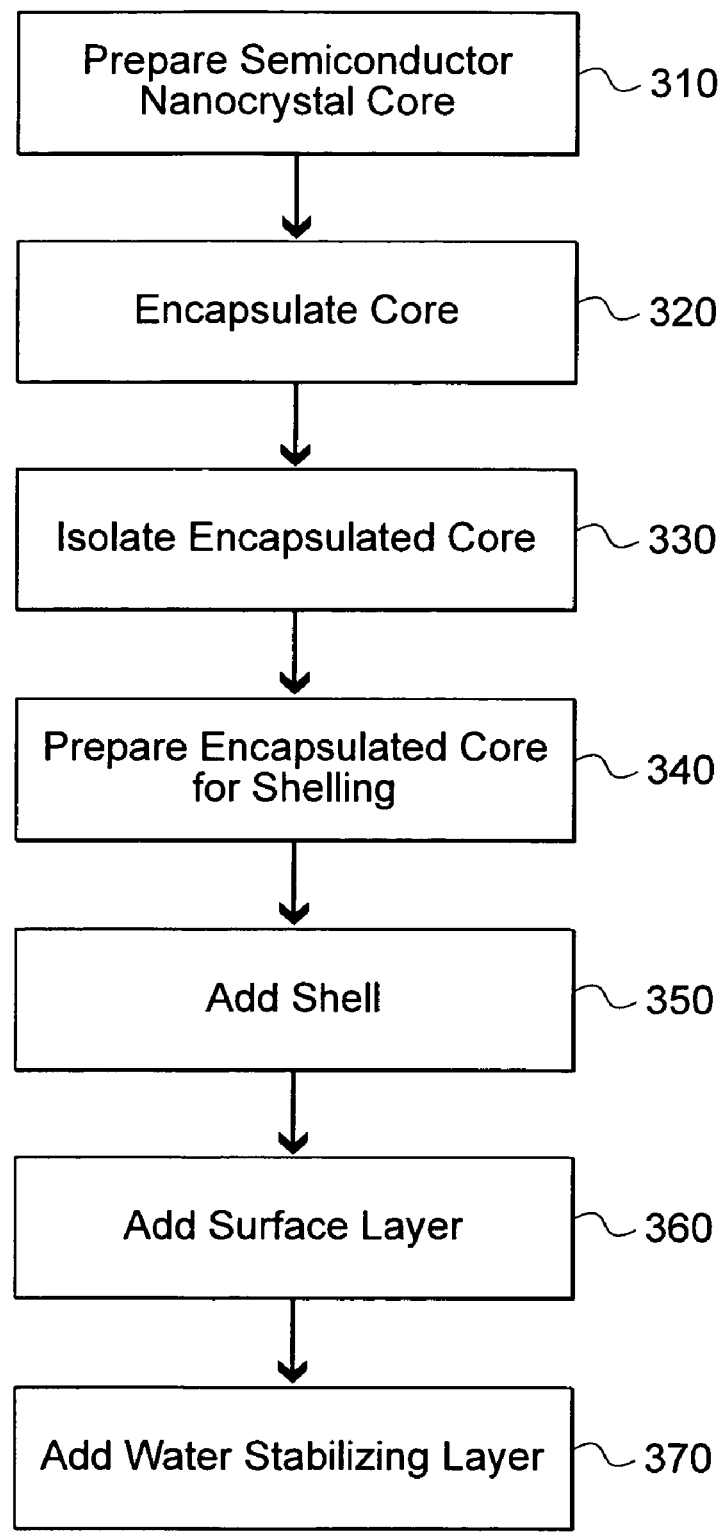
FIG. 5 is a flow chart illustrating a method of making a water-stable semiconductor nanocrystal complex according to an embodiment of the present invention.

FIG. 5 provides an exemplary method of making a water-stable nanocrystal complex of the present invention. Although the exemplary method will be described with respect to the preparation of a InGaP semiconductor nanocrystal core, a metal layer of Zn and a ZnS shell, it will be appreciated that other types and combinations of semiconductor cores, metal layers, and semiconductor shells may be used.

In step 310, a semiconductor nanocrystal core is prepared. There are numerous ways to prepare semiconductor nanocrystal cores some of which have been described above. The specific procedure for growing a core semiconductor nanocrystal comprising a III-V semiconductor material is described below. Although, the procedure is described with respect to the preparation of an InGaP core, a ternary semiconductor, a binary semiconductor material may be grown using the teachings of the procedure. One method of preparing a semiconductor nanocrystal core involves InGaP in TOPO. In order to isolate the semiconductor nanocrystals cores from a TOPO solution, methanol and toluene can be added to the solution, as semiconductor nanocrystal cores prepared in TOPO are insoluble in methanol and soluble in toluene. Enough methanol should be added to precipitate out the semiconductor nanocrystal cores and enough toluene should be added to ensure not to precipitate any of the radical complexes created during the preparation of the semiconductor nanocrystal cores. The result of washing the semiconductor nanocrystal cores in methanol and toluene results in semiconductor nanocrystals cores precipitating out of solution.

In step 320, the metal layer is added to the semiconductor nanocrystal core to encapsulate the semiconductor nanocrystal core (or to otherwise form a metal layer on the outer surface of the semiconductor nanocrystal core). Zinc oleate in TOP dissolved in methanol, for example, can be used as precursors to create the metal layer, although many other precursors may be used. For example, diethylzinc, zinc acetate, zinc oxalate, zinc stearate, and zinc oxide can be used as precursors for the preparation of a metal layer of Zn. It is also appreciated that many other precursors exist and may be used for the preparation of a metal layer comprising metals other than Zn.

Once the solution of a metal precursor(s) is prepared, it is added to the semiconductor nanocrystal core solution resulting in a solution of semiconductor nanocrystal cores, purified solvent, and metal precursor. This resulting solution can then be heated and remain heated until the metal layer is formed on the semiconductor nanocrystal core. In the procedure described below, a microwave synthesis machine is used for the reaction. It should be appreciated that in the event that traditional heating methods are used for the reaction, the amount of time necessary to form the metal layer as well as the temperature at which the reaction best occurs may vary. The resulting mixture includes semiconductor nanocrystal cores with a metal layer and the ligands used to prepare the reaction.

In step 330, the semiconductor nanocrystal cores with the metal layer are isolated. First, they can be drawn out of solution using the technique described in step 310. Specifically, methanol and toluene can be added to the solution in amounts that make the nanocrystal composition, in this case the semiconductor nanocrystal core and the metal layer, insoluble. The compositions will precipitate out of the solution resulting in a semiconductor nanocrystal composition comprising a semiconductor nanocrystal core having an outer surface and a metal layer attached to the outer surface.

Alternatively, once the compositions comprising the semiconductor nanocrystal core and the metal layer are drawn out of the solution, a shell can be added using known shelling techniques. Such an alternative embodiment involves step 340—preparing the semiconductor nanocrystal core with metal layer formed thereon for shelling. In one exemplary embodiment, ZnS is grown on the core semiconductor nanocrystal with a metal layer. Initially, the isolated nanocrystal core of the III-V semiconductor nanocrystal material and the metal layer can be dissolved in toluene and the resulting solution can be introduced into a solution containing a ligand. The ligand can be, for example, technical grade TOPO or TOP that has been purified using the technique described in step 320. The toluene can then be removed leaving a solution of the III-V core nanocrystals with a metal layer of Zn.

In step 350, the shell is added to the semiconductor nanocrystal core having a metal layer thereon. To form the shell, two precursor solutions can be added to the solution of the semiconductor nanocrystal core with metal layer thereon. The first solution can be a metal precursor in a ligand, the second solution can be $(TMS)_2S$ in TOP. Enough of the solutions is added to allow ZnS to shell the surface of the semiconductor nanocrystal core with metal layer thereon.

An alternative to shelling the semiconductor nanocrystal that can result in an outer coating of a desired semiconductor material is through the addition of a chalcagonide, pnictide or a non-metal anion layer and the addition of a second metal layer. Treating a semiconductor nanocrystal with an anion and then adding a second metal layer stabilizes the luminescent properties of the resulting composition. Additionally, treating the nanocrystal with an anion and an additional metal layer creates a resulting composition that can be stably added to a variety of solvents including water and other organic and inorganic solvents with little or no loss of fluorescence using standard nanocrystal chemistries. The procedure for adding the non-metal anion layer and the second metal layer is described below in detail.

One or more anions may be attached to the semiconductor nanocrystal core containing the newly added metal layer. Anion layer may include any number, type, combination, and arrangement of anions. For example, anion layer may be simply a monolayer of anions added to the metal layer. Non-limiting examples of elements that may comprise the anion layer include group IV, V, and VI elements. As described below, after the formation of the anion layer, a metal layer may be added to the surface of the anion layer.

Once the nanocrystal synthesis is complete, the desired nanocrystal compositions precipitate out of solution. All the above described steps may take place under nitrogen to improve the quantum yield of the resulting nanocrystal composition. The resulting nanocrystal compositions are more resistant to oxidation and have an increased quantum yield over semiconductor nanocrystals of III-V made by known techniques. The nanocrystals resulting from step 350 may be size separated. Size separating the nanocrystal yields solutions with crystals that are monodisperse and retain the quantum yield.

In step 360 and step 370, a semiconductor nanocrystal composition is made water-stable through the addition of a surface layer (step 360) and a water-stabilizing layer (step 370). As described above, surface layers are typically organic molecules that have a moiety with an affinity for the surface of the nanocrystals and another moiety with an affinity for a hydrophobic solvent. Lyophilic molecules, such as TOPO (trioctyl phosphine oxide), TOP (trioctyl phosphine), and TBP (tributyl phosphine) are typically used in the synthesis of nanocrystals and can remain on the surface after preparation of the semiconductor nanocrystals or may be added or replaced by other surfactants after synthesis. The surfactants tend to assemble into a coating around the nanocrystal and enable it to suspend in a hydrophobic solvent. Typically, a surface layer of organic molecules will be present on the surface of the nanocrystal after the completion of step 350. However, in the event that a different surface molecule is desired exchange reactions may be done to alter the surface layer.

Water stabilizing layers are generally but not exclusively linear chains and have a hydrophilic end section and a hydrophobic end section. As described above, this layer may comprise lipids or polymer-based small molecules including amino acids with a hydrophilic end section and a hydrophobic end section. Stabilizing the surface for water soluble applications can be achieved by layering a coat of hydrophilic material onto the semiconductor nanocrystal. The composition of this material can vary and can be selected based on the application to be used.

The above-described technique is only exemplary and other modifications may be made that result in semiconductor nanocrystal compositions according to the present invention.

EXAMPLE 1

Preparing a III-V Semiconductor Nanocrystal Composition

The present example discloses how to prepare a stable, high luminescent quantum yield semiconductor nanocrystal composition comprising an InGaP semiconductor nanocrystal core and a Zn metal layer formed on the outer surface of the semiconductor nanocrystal core after synthesis of the semiconductor nanocrystal core.

First, an indium precursor is prepared. In a reaction flask, 292 g/mol of 0.9 Molar indium (III) acetate (99.99% pure), is added to 367 g/mol of 0.1 Molar gallium acetylacetonoate (99% pure) and 256.4 g/mol of 3 Molar almitic acid (99% pure). The ingredients are mixed and heated to 130° C. for 2 hours under vacuum. The vacuum removes the acetic acid that could form. The resulting solution should be clear but may have a yellow tint. Next, a phosphorous precursor is prepared by adding 0.3 mL TMSphosphine and 4.0 mL TOP under nitrogen.

Then a zinc oleate precursor is prepared by heating at 140° C., 1.83 g of 10 mmol zinc acetate, 6.49 mL of oleic acid, and 3.5 mL of octadecene in a reaction flask for 2.5 hours. The resulting solution should be clear to yellow.

After the preparation of the precursors, the InGaP semiconductor nanocrystal core is prepared.

For a InGaP Semiconductor Nanocrystal Core with a Peak Emission Wavelength Between 610 nm-630 nm the Following Procedure is Followed.

In a closed reaction flask, 700 mg of the indium precursor, prepared above is added to 0.25 g of dodecyl amine, octadecyl amine or hexadecylamine, 0.25 g of 99% pure TOPO, and 2.5 mL of toluene or octadecene. The system is purged with nitrogen and the reaction is heated to 130° C. in a Discovery microwave system (CEM Corporation) and 2.5 mL of the phosphorous precursor, prepared above, is injected into the reaction flask and the reaction is heated to 270° C. for 8 minutes. During the heating process the reaction is cooled by an air strain in order retain microwave flux at 300 Watts of microwave power. The flow rate of the air is adjusted to maintain the desired microwave power. Finally, the reaction is allowed to cool to 50° C. The resulting semiconductor complex is a InGaP core semiconductor nanocrystal.

For a InGaP Semiconductor Nanocrystal Core with a Peak Emission Wavelength Between 630 nm-660 nm the Following Procedure is Followed.

In a closed reaction flask, 700 mg of the indium precursor, prepared above is added to 0.5 g of dodecyl amine, octadecyl amine or hexadecylamine, 0.5 g of 99% pure TOPO, and 2 mL of toluene or octadecene. The system is purged with nitrogen and the reaction is heated to 140° C.-150° C. in CEM Corporation's, Discovery microwave system and 2.5 mL of the phosphorous precursor, prepared above, is injected into the reaction flask and the reaction is heated to 270° C. for 8 minutes. During the heating process the reaction is cooled by an air strain in order retain microwave flux at 300 Watts of microwave power. The flow rate of the air is adjusted to maintain the desired microwave power. Finally, the reaction is allowed to cool to 50° C. The resulting semiconductor core is a InGaP core semiconductor nanocrystal.

For a InGaP Semiconductor Nanocrystal Core with a Peak Emission Wavelength Between 660 nm-690 nm the Following Procedure is Followed.

In a closed reaction flask, 700 mg of the indium precursor, prepared above is added to 0.5 g of dodecyl amine, octadecyl amine or hexadecylamine, 0.5 g of 99% pure TOPO, and 2 mL of toluene or octadecene. The system is purged with nitrogen and the reaction is heated to 160° C.-170° C. in CEM Corporation's, Discovery microwave system and 2.5 mL of the phosphorous precursor, prepared above, is injected into the reaction flask and the reaction is heated to 270° C. for 8 minutes. During the heating process the reaction is cooled by an air strain in order retain microwave flux at 300 Watts of microwave power. The flow rate of the air is adjusted to maintain the desired microwave power. Finally, the reaction is allowed to cool to 50° C. The resulting semiconductor core is a InGaP core semiconductor nanocrystal.

For a InGaP Semiconductor Nanocrystal Core with a Peak Emission Wavelength Between 690 nm-740 nm the Following Procedure is Followed.

In a closed reaction flask, 700 mg of the indium precursor, prepared above is added to 2 g of dodecyl amine, octadecyl amine or hexadecylamine, 2 g of 99% pure TOPO. The system is purged with nitrogen and the reaction is heated to 180° C. in CEM Corporation's, Discovery microwave system and 2.5 mL of the phosphorous precursor, prepared above, is injected into the reaction flask and the reaction is heated to 270° C. for 8 minutes. During the heating process the reaction is cooled by an air strain in order retain microwave flux at 300 Watts of microwave power. The flow rate of the air is adjusted to maintain the desired microwave power. Finally, the reaction is allowed to cool to 50° C. The resulting semiconductor core is a InGaP core semiconductor nanocrystal.

To any of the flasks containing the InGaP semiconductor nanocrystal composition, the 0.8 g of the zinc oleate precursor and 0.4 ml of an oleyl alcohol is added. The oleyl alcohol allows the zinc oleate to be more reactive and thus provides better surface converage around the core semiconductor nanocrystal. The system is purged with nitrogen and heated to 270° C. for 5 minutes and the reaction is allowed to cool to 50° C. During the heating process, the reaction is cooled by an air strain in order retain microwave flux at 300 Watts of microwave power. The flow rate of the air is adjusted to maintain the desired microwave power.

After the addition of the metals to the outer surface of the semiconductor nanocrystal core, the resulting semiconductor nanocrystal composition is washed. To wash the semiconductor nanocrystal composition, butanol and methanol are added to the reaction flask. The supernatants are then removed from the reaction flask by centrifuging the reaction flask at 2000 rpm for 4 minutes and decanting the supernatant. Once the supernatant is removed, the nanocrystal compositions are re-solvated in an organic solvent, such as toluene.

Once solvated, the nanocrystal compositions may be treated with an anion and a second metal layer. A sulfur source may be prepared by dissolving 70 mg of elemental sulfur (1 mM) in 4 mL TOP by heating in hot bath and sonication. To add this outer coating onto the nanocrystal composition, 0.1 ml of hexamethyldisilathiane is dissolved in 0.9 g of TOP. 1.0 mL of the prepared sulfur source is added to 1.0 mL of one of the nanocrystal composition/solvent solutions prepared above. Then 0.8 mg of TOPO, (99% pure) is added to the flask and the system is purged with nitrogen. The mixture is heated to 70° C. for 5 minute.

The resulting solution is illuminated under UV excitation for 30 minutes or gently heated for 30 minutes. This anneals the surface because it allows the the nanocrystal surface become more reactive.

A second metal layer is next added to the semiconductor nanocrystal composition. To add a second metal layer onto the nanocrystal composition, 0.86 mg of TOP (90% pure) is added to the flask containing the nanocrystal composition/organic solvent solution resulting from the washing step. 0.25 g zinc oleate is then added to the flask. In order to isolate the semiconductor nanocrystal compositions, the washing step may be performed for a third time.

EXAMPLE 2

Preparing a Water-Stable III-V Semiconductor Nanocrystal Complex

The below described procedures may be used for the development of various water-stable semiconductor nanocrystal complexes. Although specific amounts and temperatures are given in the below described procedures, it is appreciated that these amounts may be varied. The starting material for the below described procedure are the semiconductor nanocrystal compositions prepared and described above.

The below described procedure can be used to produce a water-stable semiconductor nanocrystal complex comprising approximately 3 functional groups. Depending on the size of the semiconductor nanocrystal, the ratio of lipids described below may be varied to get the appropriate number of functional groups.

EXAMPLE 2a

Carboxy Terminated Water Stable III-V Semiconductor Nanocrystal Complexes

Solution 1. 2.2 mg of any of the semiconductor nanocrystal compositions described above in toluene solution are loaded into a 15 ml centrifuge tube, and 10 ml methanol is added. The solution is mixed, and centrifuged at 4000 rpm for 3 minutes. The supernatant is removed carefully and 3 ml of hexane is added to re-dissolve the pellet of the nanocrystals. Then 9 ml methanol is added in the tube to precipitate down the nanocrystals again. The hexane and methanol purification steps are repeated one more time. The precipitate pellet is dried, and then re-dissolved into 1 ml chloroform.

Solution 2. 10 mg DSPE-PEG(2000)Carboxylic Acid(1,2-Distearoyl-sn-Glycero-3-Phosphoethanolamine-N-[Carboxy(Polyethylene Glycol)2000] (Ammonium Salt)) and 60 mg mPEG2000PE ([1,2-diacyl-sn-glycero-3-phosphoethanolamine-n-methoxy(polyethylene glycol)-2000] (Ammonium Salt)) lipids are dissolved in 3 ml chloroform solution. It has been found that a 1/6 ratio of carboxy lipid to ammonium salt lipid allows for an optimal number of functional groups, approximately three. However, these ratios may be varied depending on the number of functional groups desired on the semiconductor nanocrystal complex.

Solution 1 and solution 2 are mixed together in a 20 ml vial and the resultant solution dried under $N_2$. The vial is rotated slowly to make a thin film on the wall while the solution is drying. The vial is heated at 75° C. in a water bath for 2 minutes. To the heated vial, 5 ml deionized water, which has been preheated to 75° C., is added. Then the vial is capped, and the solution is vortexed until all the nanocrystals are dissolved. Then the solution is sonicated for 1 minute.

The solution is transferred into a 15 ml centrifuge tube, centrifuged at 4000 rpm for 5 minutes. The clear supernatant is loaded into a 10 ml syringe, and is filtrated through a 0.2 μm filter. Afterwards, the filtrated solution is loaded into two 11 ml ultracentrifuge tubes and centrifuged at 65000 rpm for 1 hour. The supernatant is removed carefully, and the precipitates is re-dissolved into deionized water. The ultracentrifuge purification step is repeated one more time. The pellets are reconstituted into 4 ml deionized water and stored at 4° C.

EXAMPLE 2b

Amine Terminated Water-Stable III-V Semiconductor Nanocrystal Complexes

Solution 1. 2.2 mg of any of the semiconductor nanocrystal compositions described above is loaded into a 15 ml centrifuge tube, and 10 ml methanol is added. The solution is mixed, and centrifuged at 4000 rpm for 3 minutes. The supernatant is removed carefully; and 3 ml of hexane is added to re-dissolve the pellet of the nanocrystals. Then 10 ml methanol is added in the tube to precipitate down the nanocrystals again. The hexane and methanol purification steps are repeated one more time. The precipitate pellet is dried and then re-dissolved in 1 ml chloroform.

Solution 2. 10 mg DSPE-PEG(2000)Amine (1,2-Distearoyl-sn-Glycero-3-Phosphoethanolamine-N-[Amino (Polyethylene Glycol)2000] (Ammonium Salt)) and 60 mg mnPEG2000PE ([1,2-diacyl-sn-glycero-3-phosphoethanolamine-n-methoxy(polyethylene glycol)-2000] (Ammonium Salt)) lipids are dissolved in 3 ml chloroform solution. It has been found that a 1/6 ratio of amine lipid to ammonium salt lipid allows for an optimal number of functional groups. However, these ratios may be varied depending on the number of functional groups desired on the semiconductor nanocrystal complex. Solution 1 and solution 2 are mixed together in a 20 ml vial and the resultant solution was dried under $N_2$. The vial is rotated slowly to make a thin film on the wall while the solution is drying. The vial is heated at 75° C. in a water bath for 2 minutes. To the heated vial, 5 ml deionized water, which had been preheated to 75° C., is added. Then the vial is capped, and the solution is vortexed until all the nanocrystals are dissolved. Then the solution is sonicated for 1 minute.

The solution is transferred into a 15 ml centrifuge tube, centrifuged at 4000 rpm for 5 minutes. The clear supernatant is loaded into a 10 ml syringe, and is filtrated through a 0.2 μm filter. Afterwards, the filtrated solution is loaded into two 11 ml ultracentrifuge tubes, centrifuged at 65000 rpm for 1 hour. The supernatant is removed carefully, and re-dissolved into deionized water. The ultracentrifuge purification step is repeated one more time and the pellets are reconstituted into 4 ml deionized water and stored at 4° C.

EXAMPLE 2c

Biotin Terminated Water-Stable III-V Semiconductor Nanocrystal Complexes

Solution 1. 2.2 mg of any of the semiconductor nanocrystal compositions described above is loaded into a 15 ml centrifuge tube, and 10 ml methanol is added. The solution is mixed, and centrifuged at 4000 rpm for 3 minutes. The supernatant is removed and 3 ml of hexane is added to re-dissolve the pellet of the nanocrystals. Then 9 ml methanol is added into the tube to precipitate down the nanocrystals again. The hexane and methanol purification step are repeated one more time. The precipitate pellet is dried under air, and then re-dissolved into 1 ml chloroform.

Solution 2. 10 mg DPPE-PEG(2000) biotin lipids(1,2-Distearoyl-sn-Glycero-3-Phosphoethanolamine-N-[Biotinyl (Polyethylene Glycol)2000(Ammonium Salt)) and 60 mg mPEG2000PE ([1,2-diacyl-sn-glycero-3-phosphoethanolamine-n-methoxy(polyethylene glycol)-2000] (Ammonium Salt)) lipids are dissolved in 3 ml chloroform solution. It has been found that a 1/6 ratio of biotin lipid to ammonium salt lipid allows for an optimal number of functional groups, approximately three in this example. However, these ratios may be varied depending on the number of functional groups desired on the semiconductor nanocrystal complex.

Solution 1 and solution 2 were mixed together in a 20 ml vial and the resultant solution are dried under $N_2$. The vial was rotated slowly to make a thin film on the wall while the solution is drying. The vial is heated at 75° C. in a water bath for 2 minutes. To the heated vial, 5 ml deionized water which has been preheated to 75° C. is added. Then the vial is capped, and the solution is vortexed until all the nanocrystals were dissolved. Then the solution is sonicated for 1 minute.

The solution is transferred into a 15 ml centrifuge tube, centrifuged at 4000 rpm for 5 minutes. The clear supernatant is loaded into a 10 ml syringe, and is filtrated through a 0.2 μm filter. Afterwards, the filtrated solution is loaded into two 11 ml ultracentrifuge tubes, centrifuged at 65,000 rpm for 1 hour. The supernatant is removed carefully, and the precipitates are re-dissolved into deionized water. The ultracentrifuge purification step is repeated one more time. The pellets are reconstitute into 4 ml deionized water and stored at 4° C.

The foregoing description and example have been set forth merely to illustrate the invention and are not intended as being limiting. Each of the disclosed aspects and embodiments of the present invention may be considered individually or in combination with other aspects, embodiments, and variations of the invention. In addition, unless otherwise specified, none of the steps of the methods of the present invention are confined to any particular order of performance. Modifications of the disclosed embodiments incorporating the spirit and substance of the invention may occur to persons skilled in the art and such modifications are within the scope of the present invention. Furthermore, all references cited herein are incorporated by reference in their entirety.

We claim:

1. A water-stable semiconductor nanocrystal complex comprising:
   a semiconductor nanocrystal composition comprising:
   a III-V semiconductor nanocrystal core;
   a metal layer formed on an outer surface of the semiconductor nanocrystal core; and
   a shell comprising a semiconductor material overcoating the metal layer;
   a surface layer comprising molecules having a moiety with an affinity for the semiconductor nanocrystal composition and a moiety with an affinity for a hydrophobic solvent; and
   a water-stabilizing layer having a hydrophobic end for interacting with the surface layer and a hydrophilic end, wherein the water-stable semiconductor nanocrystal complex is electronically and chemically stable with a luminescent quantum yield of at least 45% as measured under ambient conditions.

2. A water-stable semiconductor nanocrystal complex comprising:
a semiconductor nanocrystal composition comprising:
a III-V semiconductor nanocrystal core;
a metal layer formed on an outer surface of the semiconductor nanocrystal core; and
a shell comprising an anion layer overcoating the metal layer and a second metal layer overcoating the anion layer;
a surface layer comprising molecules having a moiety with an affinity for the semiconductor nanocrystal composition and a moiety with an affinity for a hydrophobic solvent; and
a water-stabilizing layer having a hydrophobic end for interacting with the surface layer and a hydrophobic end, wherein the water-stable semiconductor nanocrystal complex is electronically and chemically stable with a luminescent quantum yield of at least 45% as measured under ambient conditions.

3. The water-stable semiconductor nanocrystal complex of claim 1, wherein the semiconductor nanocrystal core is a ternary semiconductor nanocrystal.

4. The water-stable semiconductor nanocrystal complex of claim 3, wherein the ternary semiconductor nanocrystal is InGaP.

5. The water-stable semiconductor nanocrystal complex of claim 1, wherein the luminescent quantum yield is at least 55% as measured under ambient conditions.

6. The water-stable semiconductor nanocrystal complex of claim 1, wherein the semiconductor nanocrystal complex comprises InP, the shell comprises ZnS, and the metal layer comprises Zn.

7. The water-stable semiconductor nanocrystal complex of claim 1, wherein the hydrophilic end of the water-stabilizing layer comprises a functional group for coupling one or more tertiary molecule.

8. The water-stable semiconductor nanocrystal complex of claim 7, further comprising one or more tertiary molecule coupled to the functional group.

9. The water-stable semiconductor nanocrystal complex of claim 8, wherein the one or more tertiary molecule is a member of a specific binding pair.

10. The water-stable semiconductor nanocrystal complex of claim 9, wherein the member of the specific binding pair is selected from the group consisting of antibody, antigen, hapten, antihapten, biotin, avidin, streptavidin, IgG, protein A, protein G, drug receptor, drug, toxin receptor, toxin, carbohydrate, lectin, peptide receptor, peptide, protein receptor, protein, carbohydrate receptor, carbohydrate, polynucleotide binding protein, polynucleotide, DNA, RNA, aDNA, aRNA, enzyme, substrate.

11. A substantially monodisperse population of the water-stable semiconductor nanocrystal complexes of claim 1.

12. The water-stable semiconductor nanocrystal complex of claim 2, wherein the semiconductor nanocrystal core is a ternary semiconductor nanocrystal.

13. The water-stable semiconductor nanocrystal complex of claim 12, wherein the ternary semiconductor nanocrystal is InGaP.

14. The water-stable semiconductor nanocrystal complex of claim 2, wherein the luminescent quantum yield is at least 55% as measured under ambient conditions.

15. The water-stable semiconductor nanocrystal complex of claim 2, wherein the semiconductor nanocrystal complex comprises InP, the shell comprises ZnS, and the metal layer and the second metal layer each comprises Zn.

16. The water-stable semiconductor nanocrystal complex of claim 2, wherein the hydrophilic end of the water-stabilizing layer comprises a functional group for coupling one or more tertiary molecule.

17. The water-stable semiconductor nanocrystal complex of claim 16, further comprising one or more tertiary molecule coupled to the functional group.

18. The water-stable semiconductor nanocrystal complex of claim 17, wherein the one or more tertiary molecule is a member of a specific binding pair.

19. The water-stable semiconductor nanocrystal complex of claim 18, wherein the member of the specific binding pair is selected from the group consisting of antibody, antigen, hapten, antihapten, biotin, avidin, streptavidin, IgG, protein A, protein G, drug receptor, drug, toxin receptor, toxin, carbohydrate, lectin, peptide receptor, peptide, protein receptor, protein, carbohydrate receptor, carbohydrate, polynucleotide binding protein, polynucleotide, DNA, RNA, aDNA, aRNA, enzyme, substrate.

20. A substantially monodisperse population of the water-stable semiconductor nanocrystal complexes of claim 2.

* * * * *